United States Patent [19]
Calabrese et al.

[11] Patent Number: 5,510,216
[45] Date of Patent: Apr. 23, 1996

[54] SELECTIVE METALLIZATION PROCESS

[75] Inventors: Gary S. Calabrese, North Andover, Mass.; Jeffrey M. Calvert, Burke, Va.; Mu-San Chen, Ellicott; Walter J. Dressick, Fort Washington, both of Md.; Charles S. Dulcey, Washington, D.C.; Jacque H. Georger, Jr., Holden; John F. Bohland, Jr., Berlin, both of Mass.

[73] Assignee: Shipley Company Inc., Marlborough, Mass.

[21] Appl. No.: 520,554

[22] Filed: Aug. 29, 1995

Related U.S. Application Data

[60] Continuation of Ser. No. 226,352, Apr. 12, 1994, abandoned, which is a division of Ser. No. 111,640, Aug. 25, 1993, Pat. No. 5,468,597.

[51] Int. Cl.$^6$ ........................................................ G03F 7/16
[52] U.S. Cl. ........................... 430/16; 430/9; 430/11; 430/17
[58] Field of Search ................................ 430/9, 11, 16, 430/17

[56] References Cited

U.S. PATENT DOCUMENTS

| | | | |
|---|---|---|---|
| 5,079,600 | 1/1992 | Schnur et al. | 357/4 |
| 5,158,860 | 10/1992 | Gulla et al. | 430/315 |
| 5,233,067 | 8/1993 | Swei et al. | 556/427 |

FOREIGN PATENT DOCUMENTS 0510711  10/1992  European Pat. Off. .

*Primary Examiner*—Kathleen Duda
*Attorney, Agent, or Firm*—Robert L. Goldberg

[57] ABSTRACT

The invention is directed to a process for patterning a substrate in a selective pattern. In one embodiment, the process comprises the steps of forming a patterned coating over a substrate surface whereby portions of the substrate are covered by the patterned coating and portions of the substrate remain uncoated. A layer of a ligating material is coated over at least those portions of the substrate free of the patterned coating. The ligating layer is one that is capable of ligating with an electroless metal plating catalyst. The article so formed is then contacted with an electroless metallization catalyst and then with an electroless plating solution to form a patterned metal deposit on the substrate.

11 Claims, 2 Drawing Sheets

SELECTIVE METALLIZATION PROCESS

This application is a continuation of application Ser. No. 08/266,352 filed on Apr. 12, 1994, now abandoned, which is a divisional of application Ser. No. 08/111,640 filed on Aug. 25, 1993, now U.S. Pat. No. 5,468,597.

BACKGROUND OF THE INVENTION

1. Introduction

This invention relates to metallization of substrates in a selective pattern using ligating surfaces catalytic to electroless metal deposition. Selectively metallized layers formed in accordance with the invention may be used for diverse purposes including the manufacture of electronic devices by plasma etching or by additive plating.

2. Description of the Prior Art

Selective metallization procedures for electronic manufacture are known in the art. A process for plasma etching a substrate is disclosed in U.S. Pat. No. 5,053,318 incorporated herein by reference. In accordance with the processes of this patent, a suitable substrate, such as an electronic base material, is coated with a radiation-sensitive photoresist composition. The photoresist coating is then pattern imaged. Thereafter, and before development, the surface of the photoresist is contacted with an electroless plating catalyst. The photoresist coating is then contacted with a developer whereby plating catalyst adsorbed onto developer soluble portions of the coating is removed with solubilized photoresist. Plating catalyst remains on those portions of the coating that are insoluble in developer. This results in formation of a catalytic coating in an image pattern that conforms to the developed photoresist coating. The imaged catalytic coating is then metallized by contact with an electroless plating solution to form a thin metallic layer. The entire article is then subjected to plasma etching. The thin metallic layer functions as an etch barrier whereby the substrate is altered in a reverse image of the metallic layer. The remaining photoresist coating with the metallic layer may then be removed by contact with a photoresist stripper.

A selective metallization process for manufacture of printed circuit boards is disclosed in U.S. Pat. No. 5,158,860, incorporated herein by reference. In the process of this patent, a substrate is coated with a photoresist layer. The photoresist is then pattern imaged and developed to form a relief image. The article is then contacted with an electroless plating catalyst. The catalyst is adsorbed onto all surfaces with which it comes into contact, i.e., the side-walls of the photoresist and the underlying substrate. The top surface of the photoresist is then flood exposed. The catalytic layer adsorbed on the top surface of the photoresist coating is then removed by surface development. Catalyst remains in surfaces not exposed to activating radiation, i.e., the recesses within the photoresist relief image and on the bared substrate surface. Electroless metal may then be deposited over the catalyzed surfaces whereby the walls of the relief image and the substrate become metallized. With continued plating, the entire volume of the recesses may be filled with deposited metal.

Another approach to selective metallization is described in U.S. Pat. No. 5,079,600, incorporated herein by reference. In accordance with this patent, metal pathways are formed on the surface of a substrate by a process that comprises formation of a self-assembled monomolecular radiation reactive layer. Preferred materials are characterized by a polar end, a non-polar opposite end with a reactive moiety at or near its terminus, and an intermediate region typically composed of saturated or unsaturated hydrocarbon chains. Organosilanes are a preferred class of materials. Thereafter, the reactivity of the terminus reactive groups on the film are altered in a selective pattern by exposure to imaged radiation to cause photolytic cleavage or transformation of the reactive terminus groups. Since irradiation is in a pattern, the reactivity of the monomolecular layer is altered in a corresponding image pattern. In one embodiment, differential reactivity comprises creation of hydrophobic-hydrophilic regions in the pattern. The surface is then contacted with an electroless plating catalyst. Since the catalyst is an aqueous based material, it will selectively absorb on the hydrophilic portions of the monomolecular layer. The substrate may then be metal plated by contact with an electroless plating solution with metal depositing only over catalytic sites in the desired image pattern.

An improvement to the procedures of U.S. Pat. No. 5,077,085 is disclosed in published European Patent Application, publication No. 0,510,711, incorporated herein by reference. In accordance with preferred procedures of this application, a process for selective metallization comprises the steps of formation of a layer over a substrate having a terminus group capable of bonding with a catalyst precursor. Preferably, the terminus group is a metal ion binding or ligating group, and the layer is a self-assembled film having a terminus ligating group. Following formation of the ligating layer and imaging of the same using procedures analogous to the procedures of the above-cited U.S. Pat. No. 5,079,600, the surface contains regions having reactive ligand groups in a desired image pattern. This layer is then contacted with a catalyst precursor solution such as a solution of palladium ions. The ions bond with the ligating groups of the ligating layer. Subsequent contact of the layer with an electroless plating catalyst containing a suitable reducing agent results in selective electroless metal deposition of metal onto the ligating layer in the desired pattern.

SUMMARY OF THE INVENTION

The present invention provides a novel process for selective deposition of metallic films over substrates using ligating layers such as those disclosed in EP Application 0,510,711 identified above but using procedural steps differing from the procedures used in said application.

The process of the invention comprises the steps of formation of a ligating layer over a substrate such as an electronic base material, coating the layer with an organic coating, especially a photoresist composition, imaging the photoresist layer to provide a relief image—i.e., one having recesses therein open to the substrate, thus baring the ligating layer over the bared substrate, contact of the substrate with a catalytic precursor to bond the precursor to the exposed ligating groups to form a catalytic surface in a desired image pattern and metal deposition to form a metal layer in a desired pattern.

The catalytic precursor used is one that bonds with the ligating groups of the ligating layer typically by coordination bonding, but will not otherwise adsorb onto the surfaces of the article. This enables selective metallization because the metal depositing solution contacts catalytic material only in a desired image pattern. Following selective metallization, the metallized article can be completed such as by etching using the metal coating as an etch mask or continuing metal deposition to form a thick deposit.

The process of the invention is an improvement over processes disclosed in the published EPO Application and U.S. patents. The advantages include avoidance of a step of imaging the ligating layer, plating within recesses defined by the photoresist resulting in uniform deposits that conform to the recesses thus assisting in maintaining linewidth control, the absence of conductive pathways on the substrate surface beneath the photoresist image and the avoidance of a step of plating metal on the surface of a resist. In addition, the process is adaptable to many different exposure wavelengths by photoresist selection and by correlation of the thickness of the photoresist coating with the penetration capability of the exposure radiation.

DESCRIPTION OF THE DRAWINGS

In the drawings.

FIGS. 1A to 4A represent enlarged sections corresponding to FIGS. 1 to 4 between Section lines A and B;

DESCRIPTION OF THE PREFERRED EMBODIMENTS

Figure 1:
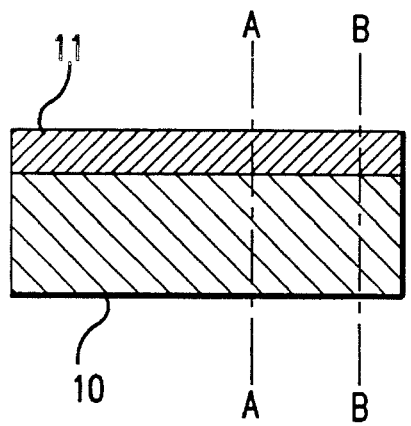
FIGS. 1 to 4 illustrate a sequence of steps for selective metal deposition.

The process of the invention is especially useful for the manufacture of electronic devices such as integrated circuits, multichip modules and printed circuit boards. The process is also useful for the fabrication of devices such as nameplates, relief plates, etc. For purposes of illustration, but not by way of limitation, the description that follows illustrates the manufacture of electronic devices. The term electronic base material means a substrate from which an electronic device is made such as a printed circuit board base material, a semiconductor, etc.

Process of the Invention

The process of the invention provides a method for formation of metal deposits in a selective pattern over essentially any solid substrate. The process is especially useful for fabrication of high-density circuit boards with linewidths of 3 mils or less and integrated circuits with linewidths of 1 micron or less. A generalized process could comprise the following steps:

(a) provide a suitably prepared substrate;

(b) form a film containing ligating groups over said substrate capable of binding with an electroless plating catalyst; and (c) form an imaged photoresist or e-beam resist coating over the substrate;

(d) contact the ligating groups bared in recesses within the resist coating with a solution of an electroless plating catalyst;

(e) deposit metal over the catalyzed surface to form a metal deposit in a desired selected pattern; and optionally, (f) remove the resist coating and alter the substrate or build a second metal layer over the first metal layer.

In the above process, steps (b) and (c) may be reversed if provision is made to remove the ligating film from the surface of the photoresist prior to metallization using procedures to be discussed below. Using a photoresist capable of providing high resolution images, the exposure and formation of an image in the coating (Step (c)) provides a relief image over the underlying substrate. The dimensions of the lines within the image are limited only by the resolution capability of the photoresist. It is known in the art that photoresist may be processed to yield submicron images—i.e., images of 0.25 microns microns or less. In a preferred embodiment of the invention, a planarizing layer is coated over the substrate prior to application of the ligating film, especially for those applications where a step of etching the substrate is to be employed. The planarizing layer reduces surface reflection from the substrate that can interfere with image resolution and eliminates depth of focus limitations. Moreover, the planarizing layer may be of a material capable of bonding with the ligating film more readily than the substrate material. The combination of the planarizing layer and the photoresist layer is preferred to a thick resist layer for enhanced image resolution. The step of contact of bared ligating groups with the electroless plating catalyst (Step (d)) results in electroless plating catalyst bonding to the ligating groups exposed by development of the resist such as by coordination bonding. Thus, there is formed an electroless plating catalyst precursor in a selective pattern which may be metallized in said pattern and confined within the recesses of the photoresist image (Step (e)).

Formation of the Ligating Surface

Process and Materials

The ligating layer may be provided over a substrate by any one of a variety of methods. Many substrate surfaces capable of being plated intrinsically contain chemical groups, or precursors of chemical groups, able to ligate with an electroless plating catalyst. Typical chemical groups capable of ligating with an electroless plating catalyst contain a donor atom selected from the group consisting of nitrogen, phosphorus, sulfur, oxygen and mixtures thereof. For example, a polyvinylpyridine film intrinsically contains such chemical groups with the pendant pyridine serving as the catalyst ligating group. As discussed herein, the pyridyl group has been found to be a particularly preferred ligating group for a palladium catalyst. For a discussion of the pyridyl moiety as a ligating group, see Calvert, et al., *Inorganic Chemistry*, 21, 3978 (1982), incorporated herein by reference. Similarly, a substrate comprising aluminum oxide will bind a palladium catalyst by the AlO and AlOH groups of the alumina. Further, though lesser preferred, the ligating material may be physically blended as one component comprising the substrate if sufficient ligating moieties are accessible at the substrate surface to ligate with the catalyst.

In a preferred embodiment of the invention, using a substrate that does not inherently comprise suitable ligating groups, the surface of the substrate is modified to impart the necessary ligating groups to the surface. Substrate modification methods include thermolysis, reaction of the surface with a chemical reagent, irradiation with photons or ions, vapor phase modification, graft polymerization, x-ray, nuclear radiation and by plasma oxidation or, more generally, any treatment that effects the desired conversion of the substrate. One potential modification sequence provides hydrolysis of a polyimide surface and reacting the hydrolyzed surface with a silane reagent possessing a suitable ligating group, such as β-trimethoxysilylethyl-2-pyridine. Another method provides chemically etching a polyethylene surface with a $Cr_2O^{2-}$ solution to provide hydroxyl groups on the substrate surface. The hydroxyl groups should then condense with a suitable compound containing a ligating group, for example nicotinoyl chloride with its pyridyl ligating group.

In accordance with the most preferred embodiment of the invention, rather than directly modifying the substrate, the substrate is provided with ligating groups by coating with one or more film layers, each layer comprising one or more suitable ligating agents. The film layer preferably adheres well to the substrate, for example by containing a functional group that will chemically and/or physically adhere to the substrate.

The bonding and ligation functions of such ligating film may be performed by application of a single film or, alternatively, by application of multiple films with subsequent intermolecular linkage. For example, β-trimethoxy-silyl-ethyl-2-pyridine provides both ligating and substrate-bonding functionalities. The alkoxysilane group can chemically bind the compound to a substrate. For instance, the tri-methoxysilyl group reacts with surface hydroxyl (silanol) functions of a quartz substrate, displacing methanol to directly bond to the substrate. The thus bound pyridyl moiety of the silylpyridyl molecule serves as a ligand for chelating with the plating catalyst.

As noted, the adhesive and ligating functions may be performed by multiple chemical groups with bond formation or other linkage between each of the groups. The linkage connecting the multiple functional groups may be of variable length and chemical composition. Examples include 3-(tri-methoxysilyl) propylamine and a quinoline-8-sulfonic acid chloride. The aminosilane is applied as the substrate adsorbent. The coated surface is then reacted with a quinoline-8-sulfonic acid chloride, the $SO_2Cl$ group coupling to the amine group of the coated surface to form a sulfonamide linkage, and the quinolinic group serving as a catalyst ligation moiety. Similarly, 3-(trimethoxysilyl) propylamine can be applied to a substrate and then reacted with the acid chloride group of 4,4'-dicarbonyl chloride-2,2'-bipyridine to form an amide linkage. The pyridyl moieties of this complex serve as catalyst ligating groups. Other silyl amines can be condensed in a similar manner, for example 3 -(triethoxysilyl)propylamine. Another sequence provides condensing the hydroxyl groups of a chemically etched polyethylene substrate with a suitable ligating precursor, for example, 3-(trimethoxysilyl)propylamine, which after formation of the oxygen-silicon bond by methanol displacement, the amino group can condense with a suitable ligating compound such as nicotinoyl chloride.

Though not necessary in accordance with the invention, the ligating chemical group comprising a radiation sensitive chromophore can provide selective photochemical patterning and metallization where selective photolysis or radiation ablation modifies the chemical groups on the substrate surface to substantially reduce or eliminate ligating ability in the selected film surface areas. Analogously, a ligating film can be employed where selective photolysis transforms a non-ligating group within the film into a ligating group. The Photo-Fries reaction where a nitro aromatic compound rearranges to form a ligand is another potential means to provide suitable ligating groups. Though it is possible to utilize any of these reactions, they constitute a lesser preferred embodiment since photolysis of the ligating compound is unnecessary in accordance with the invention.

In accordance with the most preferred embodiment, the film preferably is an ultrathin self-assembled film, which is a film defined to mean a film having a thickness of between about ten molecular layers and a single molecular (monomolecular) layer. Such a film can be formed through dip coating, spin coating or vapor phase deposition procedures as are known in the art.

The ligating film provides a substrate surface containing a chemical functional group capable of binding metallization catalysts from solution. One way of binding a catalyst to a surface is by a metal-ligand complexation, or ligation reaction. Though not wishing to be bound by theory, the ability of a substrate ligand L to bind an electroless catalyst, for example a palladium (II) catalyst, should be readily determined by examining the formation equilibrium constant $K_f$ for the generalized complexation reaction (I):

$$Pd^{2+} + L \rightleftharpoons PdL^{2+} \qquad (I)$$

wherein, $K_f$ is equal to the ratio of concentration of products to reactants in reaction (I), i.e., $$K_f = \frac{[PdL^{2+}]}{[Pd^{2+}][L]}$$

Large values of $K_f$ would indicate strong, or essentially irreversible, binding of the catalyst to the ligand. A chelate effecting a multidentate ligand provides a greater $K_f$ than a corresponding monodentate group, where the term monodentate group refers to a chemical group that can provide only one ligand binding site, and the term multidentate group refers to chemical group or groups that can provide greater than one ligand binding site. For example, chelation of Ni(II) by 2,2'-bipyridine results in a complex that is 10,000 times more stable than a pyridine complex, and 30 times more stable than a bis-pyridine complex. Further, it is believed that a higher $K_f$ provides a metal deposit with relatively greater adhesion to a substrate upon subsequent metallization.

A bipyridyl is preferred over a monopyridyl for the relatively stronger bond the bipyridyl forms with an electroless metallization catalyst and the higher quality metal deposit thereby provided. Use of suitable multidentate ligating groups has enabled deposition of thick adherent metal plates, including metal plates of thickness equal to and greater than about 2500 angstroms on smooth, unetched surfaces. In addition to bipyridyl, numerous other multidentate groups should also serve as suitable ligating groups, for example, 2,2',6,2"-terpyridine, oxalate, ethylenediamine, 8-hydroxyquinoline and 1,10-phenanthroline. Organophosphines, nitriles, carboxylates and thiols should also ligate well, i.e., exhibit a significant $K_f$, with a palladium electroless metallization catalyst. For example, 3-mercaptopropyltriethoxysilane, 2-(diphenylphosphino)-ethyltriethoxysilane, and cyanomethylphenyltrimethoxysilane should serve as suitable catalyst ligating groups in accordance with the invention. Also preferred are ligating groups with antibonding (pi*) orbitals in the ligand, for example aromatic heterocycles such as pyridine and other nitrogen-containing aromatics. Such groups give rise to dpi→pi* backbonding interactions that favor complex formation. It has thus been found that a benzyl chloride group provides poor ligating ability whereas an alkylpyridyl provides good ligation to an electroless catalyst.

Further details pertaining to the formation of a ligating layer can be found in EPO application No. 0,510,711 referenced above.

Processing Chemicals

A variety of metal-containing compounds may be employed as the electroless catalyst precursor, such as palladium, platinum, rhodium, iridium, nickel, copper, silver and gold. Palladium or palladium-containing compounds are preferred. Particularly preferred palladium species include bis-(benzonitrile)palladium dichloride, palladium dichloride and $Na_2PdCl_4$. The electroless metallization catalysts are preferably applied to the substrate as an aqueous solution.

Means for contacting a substrate with a catalyst solution may vary widely and include immersion of the substrate in a solution and spraying. The catalyst solution contact time can vary with catalyst solution composition and age.

A variety of catalyst solutions have been successfully employed, with aqueous solutions stabilized against decomposition preferred. Thus, the catalyst solution may comprise ancillary ligands, salts, buffers and other materials to enhance catalyst stability. Suitable agents for stabilizing a catalyst solution can vary with the particular catalyst employed. For instance, a metallization catalyst of $PdCl_4^{2-}$ can be stabilized in aqueous solution by addition of excess chloride ion and decreasing pH to inhibit formation of oxo-bridged oligomers of the catalyst. Stabilization can be accomplished by adjustment of chloride ion concentration during preparation of the catalyst solution, or by adjustment of chloride ion concentration after the catalyst solution has attained full catalytic activity. In addition to chloride, other anions that prevent the formation of catalyst oligomers should also be suitable agents for stabilizing a catalyst solution, for example, bromide and iodide ions.

Cation effects have also been observed in catalyst compositions. For example, use of sodium chloride with $Na_2PdCl_4$ provides an active and stabilized catalyst solution. Replacing sodium chloride with ammonium chloride in such a solution results in a solution with little or no activity as a metallization catalyst. In this case, it is believed that the lack of catalytic activity may be the result of the formation of stable cis- or trans-$(NH_3)_2PdCl_2$ species in solution. Replacing sodium chloride with tetraethylammonium chloride provides a solution that requires a shorter induction period to reach full activity, and once active remains selective and stable only for a few days. It is further noted that while a number of cations may be suitable, cation selection may be dictated by the specific metallization process. For example, for advanced microelectronic applications, use of sodium ions generally is avoided if possible and, therefore, use of tetraethylammonium chloride (TEACl) as a catalyst solution stabilizer may be preferred.

It also has been found that catalyst solutions of higher (less acidic) pH, e.g. pH of greater than 4, can be stabilized with a suitable buffer solution. Preferably, pH of a catalyst solution is controlled by a buffer component which does not appreciably coordinate with the metallization catalyst.

Additionally, it has been found that solution preparation methods can affect the stability and metallization activity of the catalyst solution. For example, catalyst solutions may be prepared using approximately equivalent initial quantities of acetate buffer, sodium chloride and $Na_2PdCl_4 \cdot 3H_2O$. An aqueous catalyst solution comprising NaCl and $Na_2PdCl_4 \cdot 3H_2O$ reaches full activity as a metallization catalyst about 24 hours after preparation at room temperature.

It also has been found that components of a catalyst solution can compete with the catalyst for binding with substrate ligating sites. For example, for 4,4'-(di(carboxylic acid-(N-3-(trimethoxysilyl)propyl)amide))-2,2'bipyridine, the $pK_a$ values of the pyridyl groups are about 4.44 and 2.6, for mono- and di-protonation respectively. Thus, in the case of a $PdCl_2/HCl$ (aq) catalyst solution, HCl may protonate the pyridyl groups and effectively compete for these sites with the palladium catalyst. While electrostatic interactions may still occur between the metallization catalyst and such a protonated ligating group, coordination type binding will be substantially reduced. It has thus been found that elimination of such ligation competitors from a catalyst solution increases coordination type binding of the catalyst to the substrate ligation functionality.

The substrate or electronic base material over which metal is to be deposited may be permanent or temporary. A permanent substrate may comprise any of a known number of desired structures. For example, the substrate may be a conventional printed circuit board, a molded circuit board, a hybrid circuit, a ceramic, a housing for an item of electronic equipment, a glass or quartz plate, etc. In one embodiment of the invention, the substrate may be an existing circuit and the process of the invention may be used to form a multi-layered circuit configuration. Another substrate may be an unclad plastic with multiple circuits built into a stack. For such applications, the metal selectively deposited may constitute circuit paths, metallized vias, etc. Other materials and configurations would be obvious to those skilled in the art.

Suitable photoresists for these processes include those photoresists known to the art such as those described in numerous publications including DeForest, *Photoresist Materials and Processes*, McGraw-Hill Book Company, New York, Ch. 2, 1975 and Moreau, *Semiconductor Lithography: Principles, Practices and Materials*, Plenum Press, N.Y., Chs. 2 and 4, 1988, incorporated herein by reference.

Positive working photoresists typically are two-component systems comprising a radiation-sensitive compound in a film forming binder where the radiation-sensitive component undergoes photochemical alteration upon exposure. The two-component system may be dissolved in a suitable solvent to make a coating composition. The light-sensitive compounds most frequently used in two-component resist systems are esters and amides formed from o-quinone diazide sulfonic and carboxylic acids, especially from sulfonic acid esters of naphthoquinone diazides. These esters and amides are well known and described by DeForest, supra, pages 47–55 and by Moreau, supra, pages 34–52. The light-sensitive compounds and the methods used to make the same are all documented in prior patents including U.S. Pat. Nos. 3,046,110; 4,596,763; and 4,588,677, all incorporated herein by reference.

The polymer binders most frequently used for positive working photoresists using o-quinone diazide sensitizers are the alkali soluble phenol formaldehyde resins known as the novolak resins. Photoresists using such polymers are illustrated in U.S. Pat. Nos. 4,377,631 and 4,404,272. Another class of binders used with o-quinone diazides are homopolymers and copolymers of vinyl phenol. Photoresists of this nature are disclosed in U.S. Pat. No. 3,869,292.

Single-component photoresists comprise a polymer that undergoes chain scission. A photoresist using a polyglutarimide polymer as a binder alone or in combination with a photoactive component is disclosed in U.S. Pat. No. 4,246,374 and further in U.S. Pat. No. 4,636,532. A photoresist using polymethylmethacrylate as a single component system is disclosed in U.S. Pat. No. 4,584,309. Polyester and polyketone resists that are single-component positive resists are disclosed in U.S. Pat. No. 4,584,309.

Negative-acting photoresists are also suitable. A preferred class of such photoresists are the acid hardening resists disclosed in EPO Application No. 0,232,972 which comprise an acid hardening resin, an aminoplast or phenoplast and a halogenated, organic, photoacid generating compound. Another preferred class of photoresists are those disclosed and claimed in U.S. Pat. No. 4,877,818, incorporated herein by reference. These resists comprise at least one polymer having charged carrier groups, a photoinitiator and a source of unsaturation for crosslinking a film upon exposure to activating radiation.

For applications requiring high image resolution, especially applications involving plasma etching procedures, the photoresist coating is desirably thin. In a preferred embodiment of the invention, the photoresist layer has a dry coating thickness of between 50 and 500 nm and more preferably, between 75 and 250 nm.

A planarizing layer is used to prevent reflection from the substrate. Suitable planarizing layers are disclosed in the examples that follow. Often, the planarizing layer contains a dye to absorb reflected light. The thickness of the planarizing layer is not critical but preferably varies between about 100 and 2,500 nm and more preferably, between 200 and 2,000 nm.

Electroless metal deposition solutions are those that deposit metal over a catalytically active surface by chemical reduction in the absence of an external electric current. Processes and compositions for electroless metal deposition are known in the art and are in substantial commercial use. They are disclosed in a number of prior art patents, for example, copper plating solutions are disclosed in U.S. Pat. Nos. 3,615,732; 3,615,733; 3,728,137; 3,846,138; 4,229,218; and 4,453,904, all incorporated herein by reference. Electroless nickel plating solutions are described in U.S. Pat. Nos. 2,690,401; 2,690,402; 2,762,723; 3,420,680; 3,515,564; and 4,467,067, all incorporated herein by reference. A large number of copper and nickel plating solutions are commercially available. Other metals that may be electrolessly deposited include gold, palladium, cobalt and tin-lead alloys. The preferred electroless metals for purposes of this invention are copper and nickel with nickel being most preferred.

The invention will be better understood by reference to FIGS. 1 through 4 which depict process steps suitable for fabrication of a printed circuit board using the process of the invention with a positive acting photoresist.

Figure 1A:
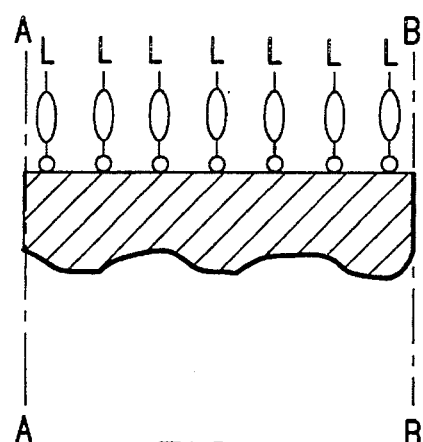

In FIG. 1, there is shown a substrate 10 coated with a ligand layer (in exaggerated proportion) 11. For purposes of illustration, the interface of the substrate 10 with ligand layer 11 lying between section lines A—A and B—B is illustrated in FIG. 1A. As shown in FIG. 1A, the substrate is coated with a ligand layer having a terminus group bonded to the substrate, a second terminus group (L) capable of complexing with a catalytic metal ion open to the environment and the two terminus groups separated from each other by an inert spacer group such as a hydrocarbon chain.

Figure 2:
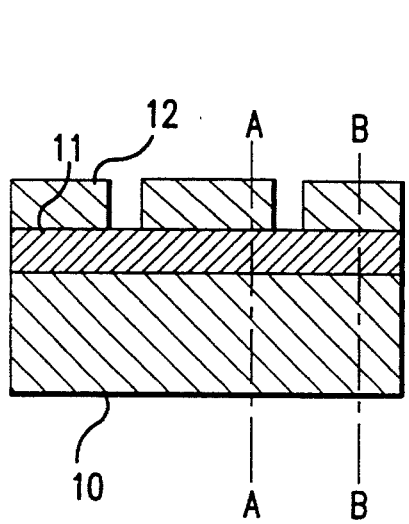
Figure 2A:
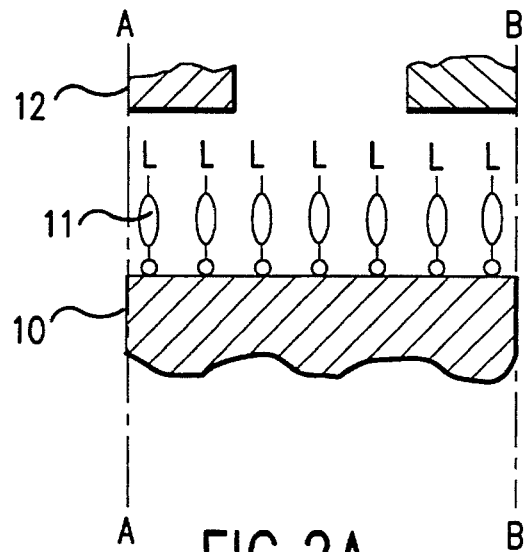

FIG. 2 illustrates a substrate 10 after it has been coated with a photoresist coating 12. As shown, the photoresist has been applied, dried, imaged by exposure to activating radiation and developed to form a patterned resist coating over substrate 10. The image may be in the form of circuit paths or any other desired pattern. Development has resulted in the formation of recesses within the photoresist coating baring ligand coating 11 where photoresist has been removed by development. This is shown in greater detail in FIG. 2A which represents both the interface of the ligand coating with substrate 10 and photoresist layer 12 in an imaged pattern.

Figure 3:
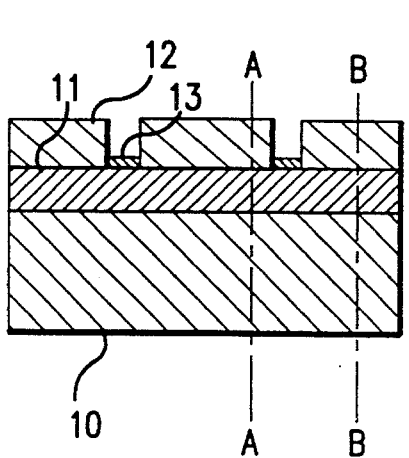
Figure 3A:
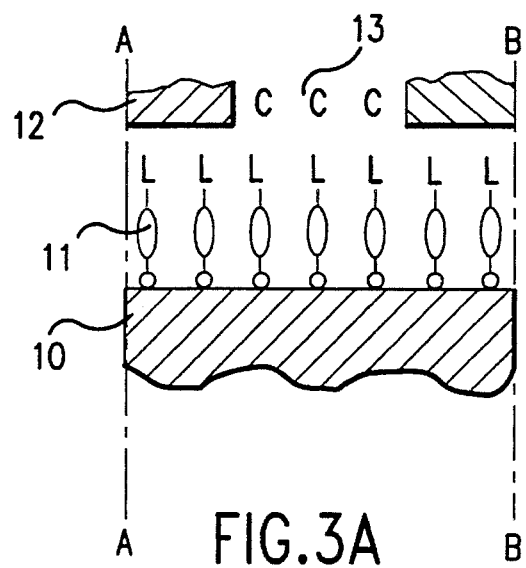

The next step in the process sequence is illustrated in FIG. 3. As shown, the entire article has been contacted with a solution of plating catalyst to form catalytic layer 13. The plating catalyst combines with the ligand layer primarily where the catalytic solution is in contact with the ligand layer in areas by baring of the same through removal of resist depending upon the selectivity of the catalyst used. In this way, plating is restricted solely to those areas where plating metal is desired avoiding extraneous plating in undesired areas. For catalysts which are lesser selective in their ability to coordinate with the ligating material, an additional step of removal of undesired catalyst should be employed. The catalyst can be readily removed from an organic layer by contact of the layer with a solvent (a developer in the case of a photoresist) to remove the top surface of the layer together with extraneous catalyst. Moreover, there is no catalytic material in the interface between layers 10 and 12. If the article to be fabricated is a high density circuit board, the presence of catalytic material could result in unwanted conductive pathways between circuit lines. The combination of the catalytic material with the ligand layer is better illustrated in FIG. 3A.

Figure 4:
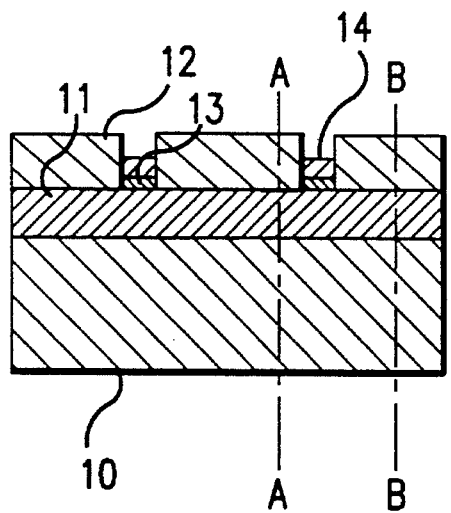
Figure 4A:
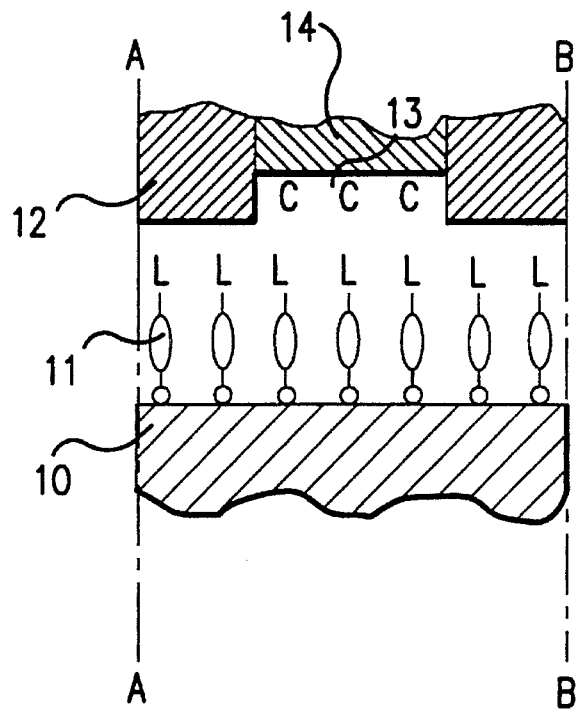

Following formation of the catalytic surface, the substrate may be plated by contact with an electroless plating solution to form a metal deposit 14 within the recesses formed by the photoresist 12 as illustrated in FIGS. 4 and 4A. The metal deposit formed may range in thickness from about 100 angstroms to several mils dependent upon the final use of the article. The thinner deposit is suitable when the deposit is used as a plasma etch barrier and the thicker deposit is suitable for use of deposit as a circuit path in a fully additive procedure for circuit board fabrication. The thickness of the deposit is dependent upon the immersion time in the plating solution, its temperature and the concentration of components within the solution.

In addition to the procedures depicted in FIGS. 1 to 4 of the drawings, there are alternative procedures for metallizing a substrate in a selective pattern. For example, the photoresist may be applied to the substrate prior to applying the ligand layer to the substrate. In this procedure, following application of the photoresist to the substrate and imaging of the same to form a relief pattern, the substrate having the imaged photoresist coating would be contacted with the ligand solution to form a ligand layer over bared substrate surfaces, the sidewalls of the photoresist coating and its top surface. Metal could then be selectively deposited by several alternative processes. For example, the photoresist may be stripped from the surface whereby the ligand will be removed with the photoresist leaving the ligand layer in a desired pattern on the substrate. The patterned ligand layer may then be metallized. Alternatively, the photoresist layer and bared substrate coated with the ligand may be metallized with a thin layer of metal followed by stripping of the photoresist to remove the metal coating overlying the photoresist, but not the substrate. A disadvantage of this approach is a ragged edge on the remaining metal deposit. As a further alternative, following contact of the imaged photoresist surface having a relief pattern therein with the ligating material, the remaining photoresist coating may be surface imaged and developed to remove the top surface of the photoresist coating and the ligand layer thereover. Thereafter, ligand bonded to the photoresist surface within the recesses of the coating and the bared substrate surface may be metallized. Finally, by proper selection of the ligand and appropriate conditioning of the substrate, the ligand could bond to the substrate without bonding to the photoresist. Thereafter, the ligand layer may be metallized in accordance with the procedures of the invention.

Figure 5:
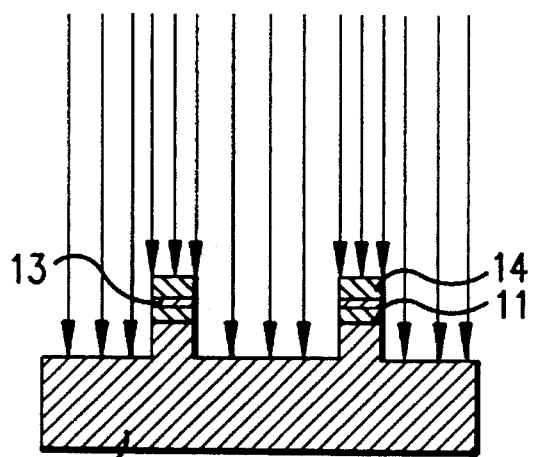
FIG. 5 illustrates the process of the invention used for etching a substrate.

The process of the invention is well suited for plasma etching of substrates. This use is illustrated in FIG. 5 of the drawings where the article of FIG. 4 (having a thin deposit of plated metal) has been subjected to plasma etching whereby those areas of substrate 10 not protected by metal layer 14, have been etched. During etching, first the resist, then the ligand layer and finally substrate 10 is removed to depth D. The metal layer 13 protects the substrate from the plasma. Following plasma etching, the metal layer and ligand layer may be removed such as by contact with an acid or lifted off with a stripper if desired.

Figure 6:
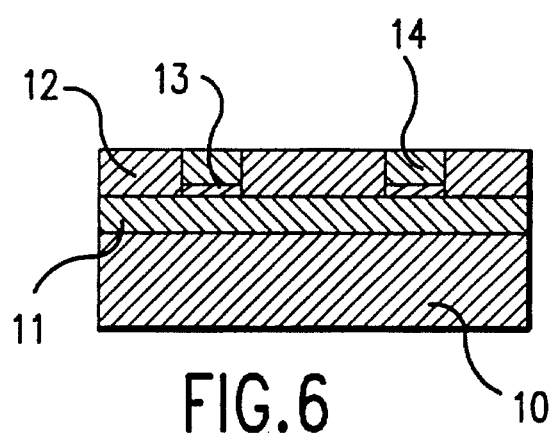
FIG. 6 illustrates the process of the invention used for additive circuit formation.

The process of the invention is also well suited for the formation of additive circuit boards. This use is illustrated in FIG. 6 of the drawings where in this instance, metal deposit 14 has been plated to full thickness of the recess. For this embodiment, if the resist layer 12 possesses suitable dielectric and thermal properties, it could remain as a permanent dielectric layer. Alternatively, it could be stripped from the substrate and replaced with a permanent dielectric material as would be understood by those skilled in the art.

The invention will be better understood by reference to the following examples.

Substrate Preparations

All inorganic substrates (silicon, silica, or quartz) were cleaned by immersion in a solution of 1:1(v/v) concentrated hydrochloric acid:methanol for 30 minutes. The substrates were then rinsed with deionized water and immersed in concentrated sulfuric acid for an additional 30 minutes, and then rinsed again with deionized water. The cleaned substrates were then transferred to a container of gently boiling water where they were stored until needed. For subsequent film formation in methanolic or aqueous solutions of ligating material, the cleaned substrates were used directly from the water rinse. For film formation from toluene solution of ligating material, substrates were dried under a stream of nitrogen gas passed through a 0.22 micron micron filter. In the examples, the silica substrates used were fused silica slides 1 inch square obtained from Esco Products or Dell Optics. Silicon wafers were obtained from International Wafer Service.

Preparation of Treatment Solutions

The Catalyst Solution

The catalyst solution used in the examples below is prepared by dissolving 11.3 mg of sodium palladous chloride trihydrate and 1 ml of 1 molar aqueous sodium chloride solution. After the solids are dissolved, a 10 ml aliquot of pH 5 buffer solution (as prepared below) is added to the palladium solution and the contents are diluted to 100 ml with deionized water. After allowing the palladium solution to stand for 24 hours, a 10 ml aliquot is removed and replaced with an equal volume of 1 molar sodium chloride aqueous solution. All catalyst solutions used in the examples were used within one week of preparation.

The Buffer Solution

The buffer solution was made from 2-(N-morpholino)ethanesulfonic acid by adding 2.13 g. of said material to 50 ml. of water with stirring until dissolved. The solution is adjusted to pH with a dilute sodium hydroxide solution. The solution is then diluted to 100 ml. to produce the final buffer.

Metallizing Baths

One Hundred Percent Nickel Metallization Bath—The 100% nickel metallization bath used was the Niposit 468 Electroless Nickel-Boron plating bath available from Shipley Company Inc. The working bath was prepared by mixing 4 ml of solution A with 88.5 ml of deionized water. To this solution was added 5 ml of solution M and then 2.5 ml of solution B. The bath was adjusted to pH 7.0 by addition of 0.1 molar sulfuric acid.

Ten Percent Nickel Metallization Bath—The 10% metallization bath was produced by mixing one volume of the standard 100% nickel-boron metallization bath described above with 9 volumes of water. In the examples that follow, all plating was done with the 10% bath unless otherwise specified. The bath was adjusted to pH 7.0 by addition of 1.0 molar sulfuric acid. The temperature of the working bath during plating was maintained typically between 20° and 25° C. unless otherwise specified.

One Hundred Percent Cobalt Metallization Bath—The 100% cobalt metallization bath was prepared immediately prior to use by mixing 3 volumes of a standard cobalt solution with 1 volume of a standard reducing solution. The standard cobalt solution is prepared by dissolving 6 g. of cobalt chloride hexhydrate, 10 g of ammonium chloride and 9.8 g of ethylenediamine tetraacetic acid, tetrasodium salt and 100 ml of deionized water and adjusting the pH to 8.2 with 2 molar sodium hydroxide aqueous solution. The standard reducing solution consists of 8 g of dimethylamine borane complex and 100 ml. of deionized water.

Twenty-Five Percent Cobalt Metallization Bath—The 25% metallization bath is produced by mixing 1 volume of the standard 100% cobalt boron metallization bath with 3 volumes of water.

EXAMPLE 1

Preparation of a silica wafer for reactive ion etching using an electroless metal barrier.

Films of N-(2-aminoethyl)-3-aminopropyltrimethoxysilane (of formula $(CH_3O)_3Si—CH_2CH_2CH_2NHCH_2CH_2NH_2$— hereafter designated as EDA) were formed on three inch diameter Si wafers having a native oxide surface as follows. Under an inert atmosphere (He-filled dry box), a 1% (v/v) solution of a silane was prepared by adding the neat silane to methanol that had previously been acidified with $1\times10^{-3}M$ acetic acid. The solution was removed from the dry box, and 5% (by volume) deionized water was added. The cleaned substrates were transferred directly into the film deposition solution. After a 15 to 20 minute immersion at room temperature, the substrates were removed and rinsed in anhydrous methanol, and then baked on a hot plate for 3 to 5 minutes at 120° C.

A water contact angle measurement (using the sessile drop method) of the freshly prepared EDA-treated surface yields a value of 17° to 25° C. The contact angles slowly increased with time and reached stable values of about 30° C. within 12 hours after sample preparation. A UV absorption spectrum of an EDA coated fused silica slide gave no measurable absorption above 200 nm.

The EDA coated wafers were catalyzed by contacting the wafer with catalyst solution for about 30 minutes. After this time, the catalyst solution was removed, the wafer rinsed with deionized water and dried under nitrogen. The wafers were then coated with SNR™248-1.0 photoresist from Shipley Company Inc. SNR248 is a deep UV sensitive, high resolution, negative working, chemically amplified photoresist that uses a poly(4-vinylphenol) resin binder and an acid catalyzed cross linking material. The resist was applied to the substrates by spincoating using a spin speed of 4,000 rpm for 30 seconds, producing about a 1 µm thick coating. The resist was then pre-exposure baked at 90° C. on a vacuum hot plate for 60 seconds. The photoresist was then exposed using patterned radiation from a Cymer CX-1 laser operating at 248 nm using KrF. The center of the laser beam was passed through a circular aperture and then spread out by a diverging fused silica lens. The diverging beam was then collimated through a fused silica lens to create a homogeneous beam with an average energy density of 1 ml/cm$^2$ per pulse. A chrome-on-fused silica optical mask with feature sizes to 10 μm was placed in direct mechanical contact with the photoresist coated wafers. Different regions of the resist were then exposed to varying amounts of 248 nm radiation ranging from 10–50 ml/cm$^2$, and then post-exposure baked at 130° C. for 1 minute. The resist was developed for 2 minutes in 0.14M NaOH. After a deionized water rinse, the wafers were immersed in the 10% nickel metallization bath for 20 minutes. All wafers plated selectively, but the best patterns with the minimum mask feature size of 10 μm were obtained with wafers exposed to 15–20 ml/cm$^2$.

EXAMPLE 2

This example is similar to Example 1 except catalysis follows application and imaging of the photoresist layer.

Four inch diameter p-type <100> Si wafers having a native oxide surface were treated with the ligating film as described in Example 1. SNR248 photoresist was spin coated onto the substrate using a spin speed of 4100 rpm for 30 seconds to form a coating 0.96 μm thick and pre-exposure baked as in Example 1. The resist was then exposed using patterned radiation from a GCA XLS 200 Laserstep 5× reduction projection stepper using a line-narrowed KrF laser at 248 nm. Exposure doses ranged from 14.5–23.6 ml/cm$^2$. The resist was post-exposure baked at 130° C. for 1 minute. The resist was developed for 75 seconds using 0.14M NaOH and then rinsed with deionized water. The wafers were then inspected under an optical reflection microscope and exhibited the expected features with linewidths to about 2.5 μm. Features smaller than this value exhibited wavy lines of variable width, presumably due to insufficient adhesion of the resist to the silanized surface. The photoresist coated surface of the wafers was treated with the plating catalyst for 30 minutes, rinsed, and then immersed in the 10% nickel metallization bath for 30 minutes. The photoresist was stripped from the wafer by immersion in acetone for 3 minutes. Inspection under an optical microscope showed that nickel deposition occurred selectively on all the wafers, and the metal structures replicated the patterns previously observed in the developed regions of the resist. However, the exposed (crosslinked) photoresist was not completely stripped from some areas of the wafer with the acetone strip, even after a second immersion in acetone with application of ultrasound for several minutes.

EXAMPLE 3

This example repeats Example 2 using an alternative stripping solution.

Wafers were treated with the EDA silane, SNR248 photoresist, exposed, developed, catalyzed and metallized as described in Example 2. The wafer was immersed in XP91-140 remover from Shipley Company Inc. for 1 minute at 25° C. to strip the crosslinked photoresist. Identical metal patterns to those described in Example 2 were obtained, and no residual photoresist was present on the water.

EXAMPLE 4

The procedure of Example 2 was repeated with a metal ion-free developer.

Wafers were treated with the EDA silane, SNR248 photoresist, exposed, and post-exposure baked as in Example 2. Wafers were then immersed in Shipley XP89-114 developer (containing tetramethylammonium hydroxide as the active ingredient)for 2 minutes. Inspection of the wafers under an optical microscope showed the expected features with linewidths to about 1 μm, although some features with linewidths to about 0.5 μm were obtained. However, the majority of features with linewidths below 1 μm exhibited similar characteristics to the higher resolution features described in Example 2, presumably also due to insufficient adhesion of the resist to the silanized surface. The photoresist coated surface of the wafers was treated with the catalyst solution, rinsed, and then immersed in the 10% nickel metallization bath for 40 minutes. The photoresist was stripped from the wafer by immersion in XP91-140 Remover for 1 minute. Inspection under an optical microscope showed that nickel deposition occurred selectively on all the wafers, and the metal structures replicated the patterns previously observed in the developed regions of the resist.

EXAMPLE 5

The procedure of Example 2 was repeated except that PEDA was used to form the ligating film.

Films (aminoethylaminomethyl)phenethyltrimethoxysilane (of formula $(CH_3O)_3SiCH_2CH_2C_6H_5CH_2NHCH_2CH_2NH_2$-hereafter designated as PEDA) were prepared as follows. Under an inert atmosphere (He-filled dry box), a 1% (v/v) solution of silane was prepared by adding the neat silane to methanol that had previously been acidified with $1\times10^3$M acetic acid. The solution was removed from the dry box and 5% (by volume) deionized water was added. The cleaned substrates were transferred directly into the film deposition solution. After a 15 to 20 minute immersion at room temperature, the substrates were removed and rinsed in anhydrous methanol, and then baked on a hot plate for 3–5 minutes at 120° C.

A water contact angle measurement of the freshly prepared PEDA-treated surface yields a value of 64°–68°. A UV absorption spectrum of a PEDA-coated fused silica slide shows a maximum at about 200 nm and a shoulder at 220 nm with ε about $5.5\times10^4 M^{-1} cm^{-1}$ and about $1.8\times10^4 M^{-1} cm^{-1}$, respectively. These values of ε are calculated from measured absorbance values and are based on a surface concentration of 10M and a path length of $1\times10^{-7}$ cm. Correspondence between the observed spectrum of PEDA on the fused silica surface and the spectrum in acetonitrile solution confirms the binding of the film to the substrate.

PEDA-treated wafers were then coated with 0.96 μm of SNR248 photoresist, pre-exposure baked at 100° C. for 1 minute, exposed to 9.8–23.3 ml/cm$^2$ of 248 nm radiation using the GCA XLS200 stepper, and post-exposure baked at 130° C. for 1 minute. Wafers were then puddle developed using XP89-114 developer for 125 seconds. Inspection of the wafers under an optical microscope showed the expected features with linewidths to about 1 μm, although some features with linewidths to about 0.5 μm were obtained. The photoresist coated surface of the wafers were catalyzed with the catalyst solution, rinsed, and then immersed in the nickel metallization bath for 40 minutes. Inspection of the wafers under an optical microscope showed that nickel deposition occurred selectively on all the wafers. The photoresist was stripped from the wafer by immersion in XP91-140 Remover for 1 minute, and the wafers were re-examined in a scanning electron microscope. Metal features to submicron dimensions were observed.

EXAMPLE 6

This example demonstrates the use of the photoresist masking process with the PEDA ligating film and with SAL-601 photoresist.

Wafers were treated with the PEDA silane as described in Example 5, coated with 0.52 µm of SAL-601 photoresist by spin coating at 5000 rpm for 38 seconds. SAL-601 is a deep UV (and also electron beam and x-ray) sensitive, high resolution, chemically amplified photoresist that employs a novolak resin. SAL-601 is supplied by Shipley Company Inc. The resist coated wafers were pre-exposure baked at 100° C. for 1 minute, exposed to 9–41 ml/cm$^2$ of 248 nm radiation using the GCA XLS200 stepper, and post-exposure baked at 110° C. for 1 minute. Wafers were then developed using 0.23M MF-312 developer from Shipley Company for 270 seconds. Inspection of the wafers under an optical microscope showed the expected features (no evidence of adhesion loss as in Examples 2 and 3) with linewidths to about 0.35 µm in bright field regions; the expected features with linewidths to about 0.45 µm were observed in the dark field regions. The photoresist coated surfaces of the wafers were catalyzed with the catalyst solution for 30 minutes, rinsed, and then immersed in the nickel metallization bath for 2 hours. The photoresist was stripped from the wafer by immersion in XP91-140 for 70 seconds, and the wafers were re-examined by optical microscopy. For all exposure doses employed, no features of 3 µm linewidth or less were present in the bright field regions. In the dark field regions, metal features were present to ≦0.45 µm, corresponding to exposure doses of 36–40 ml/cm$^2$. Inspection of the dark field regions in a scanning electron microscope showed 0.35 µm spaces with 0.7 µm metal features resolved. The metallized structures produced using the SAL-601 resist in conjunction with the PEDA ligating film exhibit sharp edges, essentially vertical sidewalls, and no observable spreading of the metal at the base of the structure. This result indicates that this resist has superior adhesion to the PEDA surface than the SNR248 resist has to the EDA surface shown in Example 5.

EXAMPLE 7

This example demonstrates the use of the photoresist masking process with the EDA ligating film and with PMMA electron beam resist on fused silica.

A three inch square fused silica plate (Hoya Electric) was treated with EDA silane as described in Example 1. The substrate was then spincoated with PMMA (950,000 molecular weight, 6% solution from KTI) at 5K rpm for 30 seconds to give a film thickness of about 0.5 µm. The PMMA was baked at 120° C. for 30 minutes. A 300 Å chrome overcoat was evaporated onto the surface of the PMMA to reduce charging effects during electron beam exposure. The resist was exposed using a Cambridge EBMF6.5 electron-beam writer at a dose of 90 µm/cm$^2$ for feature sizes ranging from 1–10 µm. After exposure, the chrome layer was removed using a CR-9 stripping solution (Cyantek). The exposed PMMA was developed by immersion in methyl isobutyl ketone for 90 seconds at room temperature. The patterned substrate was catalyzed with the catalyst solution for 30 minutes and then immersed in the nickel metallization bath for 40 minutes. The resist was stripped by immersion in acetone for 5 minutes. Selective metallization of the substrate was observed at feature sizes to about 2 µm. Some excess metallization occurred on the surface of the PMMA. A second stripping procedure in which the substrate was sonicated in acetone for 5 minutes resulted in removal of most of the excess metal and did not damage any of the selectively metallized areas of the substrate.

EXAMPLE 8

This example demonstrates the use of the photoresist masking process with SNR248 photoresist where the EDA ligand, catalyst, and electroless metal are applied after the resist is developed. The unwanted metal is then lifted off by stripping the resist.

A Si wafer having a clean native oxide surface was coated with SNR248, pre-exposure baked, exposed with 248 nm light, post-exposure baked, and developed as described in Example 1 to create patterns (topography) in the resist. The wafer was then treated with the methanolic EDA solution described in Example 1, catalyzed with the catalyst solution for 30 minutes, and plated with 25% cobalt bath for about 10 minutes. The homogeneously plated, patterned wafers were treated with acetone at room temperature to dissolve the crosslinked resist, causing the metal on the exposed region to lift off along with the photoresist. This resulted in adherent (passed Scotch® tape test) metal patterns to about 10 µm feature size on the wafer which gave the reverse image of the original resist pattern. However, most of these images suffered from ragged edges due to tearing of the metal film during liftoff of the resist/metal regions. This result shows that the EDA silane treatment caused the ligating film to be applied to the surface of the unexposed resist as well as to the surface of the wafer in the exposed regions.

EXAMPLE 9

This example demonstrates the use of the photoresist masking process with SNR248 photoresist and the EDA ligating film, where the unexposed resist is stripped prior to metallization.

To minimize the edge roughness observed in Example 8, a similar process was performed except the resist stripping step was after catalysis, but before metallization. A Si wafer was coated with SNR248, softbaked, exposed through a contact mask to 50 ml/cm$^2$ from a KrF excimer laser, postbaked, then developed for 3 minutes with XP89-114 developer. The patterned wafer was treated with the dilute EDA solution and then catalyzed with the catalyst solution for 15 minutes. The crosslinked resist remaining was stripped with acetone and then immersed into a 25% cobalt plating bath for 10 minutes. This resulted in adherent cobalt patterns directly on the wafer, many with submicron edge roughness and 10 µm features resolved, a considerable improvement over the results of Example 8. However, in some areas of the wafer, excess unmetallized resist material was present which could not be stripped by longer immersion times in acetone. Characterization of the cobalt plated surface using Auger electron spectroscopy shows no palladium or copper in the exposed regions under the resist.

EXAMPLE 10

This example demonstrates the use of the photoresist masking process with SNR248 photoresist and the EDA ligating film, where the unexposed resist is stripped prior to metallization.

A Si wafer was processed in a similar manner to Example 9, except the methanolic EDA solution was used as both the developer and surface modification step. The wafer was then catalyzed, stripped, and plated as described above. This

EXAMPLE 11

This example demonstrates the use of the photoresist masking process with the PEDA ligating film and with S1400 photoresist on silicon.

A Si wafer was treated with PEDA silane as described in Example 1. (In the rinse step after film formation both a deionized rinse and a 0.1M HCl rinse gave comparable results, indicating a lack of sensitivity of this process to a protonated surface film.) The wafer was then coated with about 1.0 µm of Shipley S1400-27 photoresist by spin coating at 4000 rpm for 30 seconds. S1400-27 is a UV sensitive, high resolution, diazonapthoquinone based photoresist that employs a novolak resin. The resist coated wafers were pre-exposure baked at 90° C. for 30 minutes and exposed for 13 seconds at 5 mW/cm$^2$ using a standard Karl Suss vacuum contact aligner with a standard UV lamp source (365–405 nm output). The mask employed was a chrome-on-fused silica plate with serpentine and cross-bridge structures having linewidths to 10 µm. Wafers were then developed using 0.27M (1:1 dilution of concentrate) MF-312 developer from Shipley Company for 45 seconds. Inspection of the wafers under an optical microscope showed the expected features (no evidence of adhesion loss) with linewidths to 10 µm—the minimum feature size on the mask. The photoresist coated surfaces of the wafers were catalyzed with the catalyst solution, rinsed, and then immersed in the nickel metallization bath for 20 minutes. The photoresist was stripped from the wafer by immersion in acetone for about 30 seconds, rinsed with deionized water, and the wafer was dried under N$_2$. Inspection of the wafer under an optical microscope showed the serpentine and cross-bridge structures replicated in nickel metal with the same feature sizes as on the mask.

EXAMPLE 12

This example demonstrates the use of the photoresist masking process with the PEDA ligating film and with S1400 photoresist to produce submicron features on silicon.

A Si wafer was treated with the PEDA silane, coated with S1400-27 photoresist, exposed using a high resolution transistor test structure mask, developed (40 seconds in MF-312), metallized, and stripped as described in Example 11. Inspection of the wafers under an optical microscope showed metal features with linewidths to <1 µm.

EXAMPLE 13

This example demonstrates the use of the photoresist masking process with the PEDA ligating film and with S1400 photoresist on CVD diamond.

The wafer was placed in a Branson plasma etcher for 2 minutes at 100 W RF power using 150 sccm O$_2$. The hydrophilic surface was then treated with the PEDA silane as described above. S1400-27 photoresist was coated onto the wafer, exposed (serpentine mask), developed, catalyzed, and plated with nickel (for 2 hours) as described in Example 11. After resist removal with acetone, the wafer was inspected by optical and electron microscopy. Selective metal deposition was observed with feature sizes to 10 µm, the minimum linewidth present on the mask employed.

EXAMPLE 14

This example demonstrates the use of the photoresist masking process with the UTF-15 ligating film and with S1400 photoresist on Si.

Films of 2-(trimethoxysilyl)ethyl-2-pyridine (of formula (CH$_3$O)$_3$SiCH$_2$CH$_2$C$_5$H$_4$N, hereafter designated as UTF-15) were prepared as follows. Under an inert atmosphere (He-filled dry box), a 1% (v/v) solution of UTF-15 was prepared by adding the neat silane to toluene that had previously been acidified with 10$^3$M acetic acid. The solution was removed from the dry box and the cleaned, dry substrates were transferred into the film deposition solution at room temperature. The solution was warmed for 60 minutes on a hotplate until the temperature of the solution reached 65° C. The substrates were removed from the solution and rinsed twice in fresh toluene, then baked for 3 minutes at 120° C. on a hotplate.

A contact angle measurement of the surface of the slide yields a value of 45°. A UV absorption spectrum of a UTF-15 coated fused silica slide showed absorption maxima at 200 nm and 260 nm and $\epsilon$=4900M$^{-1}$ cm$^{-1}$, respectively. Correspondence between this spectrum and that of UTF-15 in acetonitrile solution confirms the binding of UTF-15 to the fused silica surface.

The UTF-15 treated substrate was then coated with S1400-27 photoresist, exposed, developed, catalyzed, metallized, and stripped as described in Example 11. Inspection of the wafer under an optical microscope showed the serpentine and cross-bridge structures replicated in nickel metal with the same feature sizes as on the mask.

EXAMPLE 15

This example demonstrates the use of the photoresist masking process with the UTF-60 ligating film and with S1400 photoresist on Si.

Films of 2-(diphenylphosphino)ethyltriethoxysilane (of formula (CH$_3$CH$_2$O)$_3$SiCH$_2$CH$_2$P(C$_6$H$_5$)$_2$, hereafter designated as UTF-60) were prepared on Si wafers and fused silica slides as follows. Under an inert atmosphere (He-filled dry box), a 1% (v/v) solution of UTF-60 was prepared by adding the neat silane to toluene that had previously been acidified with 10$^3$M acetic acid. The solution was removed from the dry box and the cleaned, dry substrates were transferred into the film deposition solution at room temperature. The solution was warmed for 40 minutes on a hotplate until the temperature of the solution reached 65° C. The substrates were removed from the solution and rinsed twice in fresh toluene, then baked for 3 minutes at 120° C. on a hotplate.

Water contact angle measurements yield a value of (48±2)°. A UV absorption spectrum of a UTF-60 coated fused silica slide showed absorption maxima at 200 nm and 260 nm and a shoulder at about 230 nm. Correspondence between this spectrum and that of UTF-60 in acetonitrile solution confirms the binding of UTF-60 to the fused silica surface.

The UTF-60 treated substrate was then coated with S1400-27 photoresist, exposed, developed, catalyzed, metallized, and stripped as described in Example 11. Inspection of the wafer under an optical microscope showed the serpentine and cross-bridge structures replicated in nickel metal with the same feature sizes as on the mask.

process gave similar resolution, adhesion (passes Scotch tape test), and excess unmetallized resist characteristics to the approach described in Example 9.

EXAMPLE 16

This example demonstrates the use of the photoresist masking process with the aqueous EDA ligating film and with S1400 photoresist to produce submicron features on silicon.

A Si wafer was treated with the EDA silane as described in Example 1, with the exception that the treatment solution was entirely aqueous (1% silane in water with $1\times10^3$M acetic acid). The EDA treated wafer was then coated with S1400-27 photoresist, exposed using a standard UV contact aligner and a high resolution transistor test structure mask. The wafer was developed, metallized, and stripped as described in Example 11. Inspection of the wafers under an optical microscope showed metal features with linewidths to <1 μm.

EXAMPLE 17

This example demonstrates the use of the photoresist masking process with the aqueous DETA ligating film and with S1400 photoresist to produce about 0.5 μm thick metal features on Si.

Films of trimethoxysilylpropyldiethylenetriamine (of formula $(CH_3O)_3Si(CH_2)_3NH(CH_2)_2NH(CH_2)_2NH_2$, hereafter designated as DETA) were formed on Si wafers having a native oxide surface as follows. A 1% (v/v) solution of silane was prepared by adding the neat silane to water that had previously been acidified with $1\times10^{-3}$M acetic acid. The cleaned substrates were transferred directly into the film deposition solution. After a 15–20 minute immersion at room temperature, the substrates were removed and rinsed in anhydrous methanol, and then baked on a hotplate for 5 minutes at 120° C. Water contact angle measurements and UV spectroscopy give essentially identical results to the EDA films formed from aqueous acidic methanol, as described in Example 1.

A Si wafer was treated with the aqueous DETA silane and processed as described in Example 16 for EDA, with the exception that the immersion time in the electroless nickel bath was 3 hours at a temperature of about 40° C. Inspection of the wafers under an optical microscope showed metal features with linewidths to <1 μm. Surface profilometry showed the thickness of the metal features to be 0.47 μm.

Example 18

This example demonstrates the use of the photoresist masking process with the aqueous DETA ligating film and with S1400 photoresist to produce metal features on a cross-linked SNR248 polymeric planarizer.

Two clean, four inch diameter Si wafers were primed by spincoating neat hexamethyldisilazane (HMDS) at 4000 rpm for 30 seconds. SNR248 films (about 1 μm thick) were applied to the primed wafers by spincoating at 4000 rpm for 30 seconds. The SNR248 photoresist was softbaked at 90° C. for 30 minutes on a vacuum hotplate, then thermally crosslinked by heating to 180° C. for 4 minutes. The crosslinked SNR248 photoresist serves as the planarizing layer.

On one of the wafers, the SNR248 planarizing layer was surface oxidized as described in Example 13, by exposure to an RF oxygen plasma at 100 W for 2 minutes. Contact angle using a water drop showed that the initially hydrophobic (contact angle about 60°–70°) SNR248 film became hydrophilic (contact angle ≦20°) after-plasma oxidation interferometric measurements showed that the SNR248 film thickness was essentially unchanged (within several nm) after plasma oxidation. This indicates that the plasma affects the functional groups in only the outer few nm of the film.

Both wafers were then treated with a 1% aqueous DETA silane solution as described in Example 17. The silanized wafers were coated with S1400-27 photoresist by spin coating at 4000 rpm for 30 seconds and then pre-exposure baked at 90° C. for 30 minutes. The resist-coated wafers were exposed on a standard UV contact aligner using the serpentine mask for 18 seconds at 5 mW/cm$^2$. Wafers were developed using 0.27M MF-312 developer for 60 seconds, then catalyzed with the catalyzing solution for 30 minutes and plated with electroless nickel for 20 minutes.

Selective metallization to produce the expected serpentine patterns was observed on both wafers; however, the plasma oxidized wafer exhibited uniform features production across the entire wafer, whereas the degree of uniformity of metallization was noticeably poorer on the unoxidized sample. This indicates that functionalization of the crosslinked SNR248 planarizer with DETA can occur, but the degree of functionalization is increased by the plasma treatment.

EXAMPLE 19

This example demonstrates the use of the photoresist masking process with the aqueous DETA ligating film and with S1400 photoresist to produce metal features on an epoxy dielectric material.

A Si wafer coated with Shipley Multiposit™ XP91111 EC photodielectric, an epoxy-based innerlayer dielectric coating (about 6 μm thick), was used as a planarizing layer instead of SNR248, as described in Example 18. The wafer was then processed (plasma oxidized, silanized with DETA, coated with photoresist, exposed, developed, catalyzed, and metallized) as described in Example 18, except the development time was 85 seconds. Metal serpentine patterns were produced homogeneously across the wafer.

EXAMPLE 20

This example demonstrates the use of the photoresist masking process on epoxy dielectric material with an aged silane film.

A Si wafer coated with an epoxy-based interlayer dielectric coating was processed as described in Example 19, except that the DETA-coated epoxy film was allowed to stand in the clean room for three days prior to application of the photoresist. Results obtained were identical to those in Example 19.

EXAMPLE 21

This example demonstrates the use of the photoresist masking process with the aqueous EDA ligating film and with S1400 photoresist to produce metal features on an epoxy dielectric material.

An epoxy-coated Si wafer was processed as described in Example 19, except that an aqueous solution of EDA (see Example 16) was used as the silanizing agent. Results obtained were identical to those in Example 19.

EXAMPLE 22

This example demonstrates the use of the photoresist masking process on an epoxy planarizing layer to build up thick metal films.

An epoxy-coated Si wafer was processed as described in Example 19, except the immersion time in the electroless nickel bath was 22 hours. Similar results were obtained to those in Example 19, except the thickness of the metal coating was about 0.5–0.55 μm, as determined by surface profilometry.

EXAMPLE 23

This example demonstrates the use of the photoresist masking process with the aqueous DETA ligating film and with S1400 photoresist to produce submicron features on silicon.

A Si wafer was coated with DETA silane from aqueous solution as described in example 17. S1400-17 photoresist was prepared by diluting S1400-27 to 63% of its original concentration with Shipley Thinner Type A. The photoresist was spincoated at 4000 rpm for 30 seconds to give a thickness of 0.7 µm, then softbaked at 90° C. for 30 minutes. The resist was exposed using a deep UV contact aligner with a high resolution grating mask for 4–5 seconds at 4 mW/cm$^2$. The resist was developed for 60 seconds in MF-312 (0.27M), catalyzed for 30 minutes with the catalyzing solution, metallized with electroless nickel for 20 minutes and then stripped by immersion in acetone for about 30 seconds. Inspection of the wafer by scanning electron microscopy showed selective deposition of metal grating structures homogeneously across the water with a minimum feature size of about 0.45 µm, corresponding to the minimum feature size present on the mask.

EXAMPLE 24

This example demonstrates the use of the photoresist masking process with the aqueous DETA ligating film and with S1400 photoresist to produce metal features on a photochemically crosslinked SNR248 planarizer.

A four inch diameter Si wafer was processed in a similar manner to that described in Example 18, with the following exceptions: the SNR248 planarizing layer was crosslinked by flood exposure for 2 minutes using the deep UV contact aligner at 4 mWcm$^2$, the crosslinked SNR248 was plasma oxidized as described for one of the wafers in Example 18. Selective metallization to produce the expected serpentine patterns was observed on both wafers. It was observed that the photochemical crosslinking produced a smoother photoresist surface (fewer bubbles or pits) than the thermal crosslinking procedure.

After metallization, the wafer was again flood exposed for 1 minute using a standard UV contact aligner at 5 mW/cm$^2$ to convert the initially unexposed resist to the exposed (soluble) form. The remaining exposed photoresist was then stripped by immersion for 60 seconds in the 0.27M MF-312 developer solution. The photochemical stripping step provides an alternative method to stripping with acetone for situations in which an aqueous based solution is preferred as a stripping reagent.

EXAMPLE 25

This example demonstrates the use of the photoresist masking process with the aqueous DETA ligating film and with S1400 photoresist using deep UV exposure to produce submicron metal features on a photochemically cross-linked SNR248 planarizer.

A four inch diameter Si wafer was processed in a similar manner to that described in Example 24, with the following exceptions: S1400-17 photoresist was employed (as described in Example 23), and the resist was exposed with a high resolution grating mask on a deep UV contact aligner for 6–8 seconds at 4 mW/cm$^2$. Selective metallization to produce grating structures with feature sizes to 0.6 µm was observed on the wafer.

EXAMPLE 26

This example demonstrates the use of the photoresist masking process with the DETA ligating film and with S1400 photoresist on CVD diamond.

A three inch Si wafer with a coating of CVD diamond was processed as described in Example 13 with the following exceptions: the silanization was performed with aqueous DETA (see Example 17), development time was 70 seconds, and nickel plating time was 8 hours. Upon inspection by optical microscopy the wafer exhibited homogeneous, selective metal deposition with the expected serpentine features to 10 µm linewidth.

EXAMPLE 27

This example demonstrates the use of the photoresist masking process with the aqueous DETA ligating film and with S1400 photoresist using an i-line projection stepper to produce submicron features on silicon.

A Si wafer was processed as described in Example 23 with the exception that the S1400-17 photoresist was exposed using a GCA 0.45 NA i-line (365 nm) projection stepper. An exposure array was performed using a high resolution reticle with doses ranging from about 29–209 ml/cm$^2$. Inspection of the wafer after metallization and stripping with acetone showed production of metal features uniformly across the wafer. The minimum resolvable features were equal line/space pairs having linewidths to 0.40 µm.

EXAMPLE 28

This example illustrates nickel deposition within a photoresist image using an aqueous EDA ligating film on silica and a 193 nm contact printer.

A silicon wafer was coated with the EDA silane from the same aqueous solution used in Example 16. The EDA modified wafer was then coated with S1400-7 photoresist (a novolak-diazo based photoresist available from Shipley Company Inc.) to provide an approximately 115 nm thick film. The photoresist was exposed to 20 ml/cm$^2$ at 193 nm radiation using an ArF laser and a serpentine mask held in hard contact with the wafer. The exposed photoresist layer was developed by immersion in MF 312 developer (aqueous alkaline solution)for 55 seconds and rinsed with deionized water. The wafer was catalyzed with Ac3 catalyst for thirty minutes and electrolessly plated with a 10% solution of NI 468 nickel plating solution at 22° C. for 20 minutes. The unexposed resist was then stripped by spraying with acetone for 10 seconds. Inspection of the wafer showed metal features having line widths to 10 microns.

EXAMPLE 29

This example is similar to Example 28 but utilizes a planarizing layer.

A silicon wafer was coated with a novolak base planarizing film by spin coating at 3,000 rpm for 30 seconds. The planarizer film was soft baked at 100° C. for 1 minute on a vacuum hot plate and then hard baked at 140° C. for 1 minute. The planarizing film was then coated with EDA silane from aqueous solution as described in Example 16, rinsed with deionized water and baked at 120° C. for 5 minutes. The EDA modified planarizer was coated with the photoresist of Example 28, exposed to 193 nm radiation, developed and then metallized using the procedure set forth in Example 28. The wafer showed metal features with serpentine features having line widths to 10 microns. Repeat of the process with exposure ranging between 15 and 20 ml/cm² at 193 nm radiation through a high resolution mass grading yielded features with line widths to 1 micron.

EXAMPLE 30

This example is similar to Example 28 but uses a standard UV exposure.

A silicon wafer was coated with a novolak resin planarizing layer and silanized with EDA using the procedures of Example 29. The S1400-27 photoresist was spin coated onto the planarizing layer to a thickness of 1 micron and exposed with a standard UV contact aligner for 22 seconds at 5 mW/cm² as described in Example 11. The resist was developed and metallized with electroless nickel following procedures of Example 28. The wafer showed metal features having a serpentine configuration and line widths to 10 microns.

EXAMPLE 31

This example is similar to Example 28 but uses deep UV exposure.

A silicon wafer was coated with the novolak planarizing layer and silanized with EDA as described in Example 29. The S1400-17 photoresist was coated onto the planarizing layer to a thickness of 0.5 microns, exposed with a deep UV (254 nm) contact aligner for 4 seconds at 4 mW/cm² using a high resolution mask. The resist was developed for 45 seconds and metallized with electroless nickel using the procedures of Example 28. The remaining photoresist was stripped. In one procedure, stripping was with an acetone spray. In another procedure, stripping was through the use of an RF oxygen plasma. The wafer showed metal features having line space features with line and space widths to 1 micron.

EXAMPLE 32

This example repeats the process of Example 28 using i-line exposure.

A silicon wafer was coated with a novolak planarizing layer and silanized with EDA following the procedures of Example 29. A layer of S1400-17 photoresist was spin coated onto the planarizing layer to a thickness of 0.5 microns and exposed with an i-line (365 nm) projection exposure tool for doses ranging from 10–160 ml/cm². The resist was developed for 75 seconds, and metallized with an electroless nickel coating as described in Example 28. The wafer showed metal features of various test patterns with linewidths to 0.6 microns.

We claim:

1. An article of manufacture comprising a substrate having a layer of a ligating material over its entire surface, a layer of an organic material having recesses defined therein over said substrate and said ligating material and a metal coating over a portion of said substrate in a selected pattern confined within the recesses of said layer of organic material and being bonded to said substrate through an intermediate layer of catalyzed ligating material, said ligating material comprising a ligating material having one end bonded to the substrate and said catalyzed ligating material comprising said ligating material having one end bonded to the substrate and its other end bonded to an electroless metal plating catalytic material.

2. The article of claim 1 where said catalyzed ligating material comprises an electroless plating catalyst coordinatively bonded to said ligating material.

3. The article of claim 1 where said ligating material has chemical groups with donor atoms selected from the group consisting of nitrogen, phosphorus, sulfur, oxygen and mixtures thereof.

4. The article of claim 3 where the donor atoms are nitrogen atoms.

5. The article of claim 1 where the organic coating material is a photoresist.

6. The article of claim 1 where the substrate comprises an electronic base material coated with a planarizing layer.

7. The article of claim 1 where the electronic base material is an integrated circuit.

8. The article of claim 1 where the metal in a selected pattern is a circuit pathway.

9. The article of claim 1 where the metal in a selected pattern is a via.

10. The article of claim 1 where the metal in a selected pattern is an etch mask.

11. The article of claim 1 where the metal in a selected pattern is a lithographic mask.

* * * * *